United States Patent
Wang et al.

(10) Patent No.: US 10,510,825 B2
(45) Date of Patent: Dec. 17, 2019

(54) METAL-INSULATOR-METAL CAPACITOR WITH IMPROVED TIME-DEPENDENT DIELECTRIC BREAKDOWN

(71) Applicant: GLOBALFOUNDRIES Singapore Pte. Ltd., Singapore (SG)

(72) Inventors: Zhehui Wang, Singapore (SG); Hai Cong, Singapore (SG); Ramadas Nambatyathu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/790,064

(22) Filed: Oct. 23, 2017

(65) Prior Publication Data
US 2019/0123130 A1    Apr. 25, 2019

(51) Int. Cl.
*H01L 49/02*    (2006.01)
*H01L 23/522*   (2006.01)
*H01L 21/768*   (2006.01)

(52) U.S. Cl.
CPC ........ *H01L 28/60* (2013.01); *H01L 21/76877* (2013.01); *H01L 23/5223* (2013.01); *H01L 23/5228* (2013.01); *H01L 28/20* (2013.01)

(58) Field of Classification Search
CPC ............. H01L 28/60; H01L 23/5228; H01L 21/76877; H01L 23/5223; H01L 28/20
See application file for complete search history.

(56) References Cited

U.S. PATENT DOCUMENTS

| | | | |
|---|---|---|---|
| 6,333,224 B1* | 12/2001 | Lee | H01L 28/40 257/E21.008 |
| 8,101,493 B2* | 1/2012 | Lee | H01L 21/0273 257/E21.011 |
| 9,768,244 B1* | 9/2017 | Liu | H01L 28/60 |
| 2002/0123008 A1* | 9/2002 | Ning | H01L 21/32136 430/318 |
| 2003/0003621 A1* | 1/2003 | Rhodes | C23C 16/40 438/104 |
| 2003/0062563 A1* | 4/2003 | Okita | H01L 21/31691 257/303 |
| 2007/0045774 A1* | 3/2007 | Huber | H01L 21/0206 257/532 |
| 2007/0048962 A1* | 3/2007 | Hendy | H01L 27/0805 438/396 |
| 2008/0073750 A1* | 3/2008 | Kanaya | G11C 11/22 257/532 |
| 2010/0164065 A1* | 7/2010 | Lee | H01L 21/0273 257/532 |
| 2016/0308505 A1* | 10/2016 | Korony | H03H 7/06 |
| 2017/0141093 A1* | 5/2017 | Kodama | H01L 21/52 |

* cited by examiner

*Primary Examiner* — Earl N Taylor
(74) *Attorney, Agent, or Firm* — Thompson Hine LLP

(57) ABSTRACT

A reliable metal insulator metal (MIM) capacitor is disclosed. The MIM capacitor is disposed over at least an interlevel dielectric (ILD) layer of a plurality of ILD layers with interconnects disposed over a substrate. The MIM capacitor includes a capacitor dielectric disposed between top and bottom metal capacitor electrodes. The edges of the top metal electrode at the interface with the capacitor dielectric are rounded. The rounded edges of the top capacitor electrode at the interface with the capacitor dielectric reduce edge electric field, thereby improves time-dependent dielectric breakdown (TDDB) reliability of the capacitor.

18 Claims, 14 Drawing Sheets

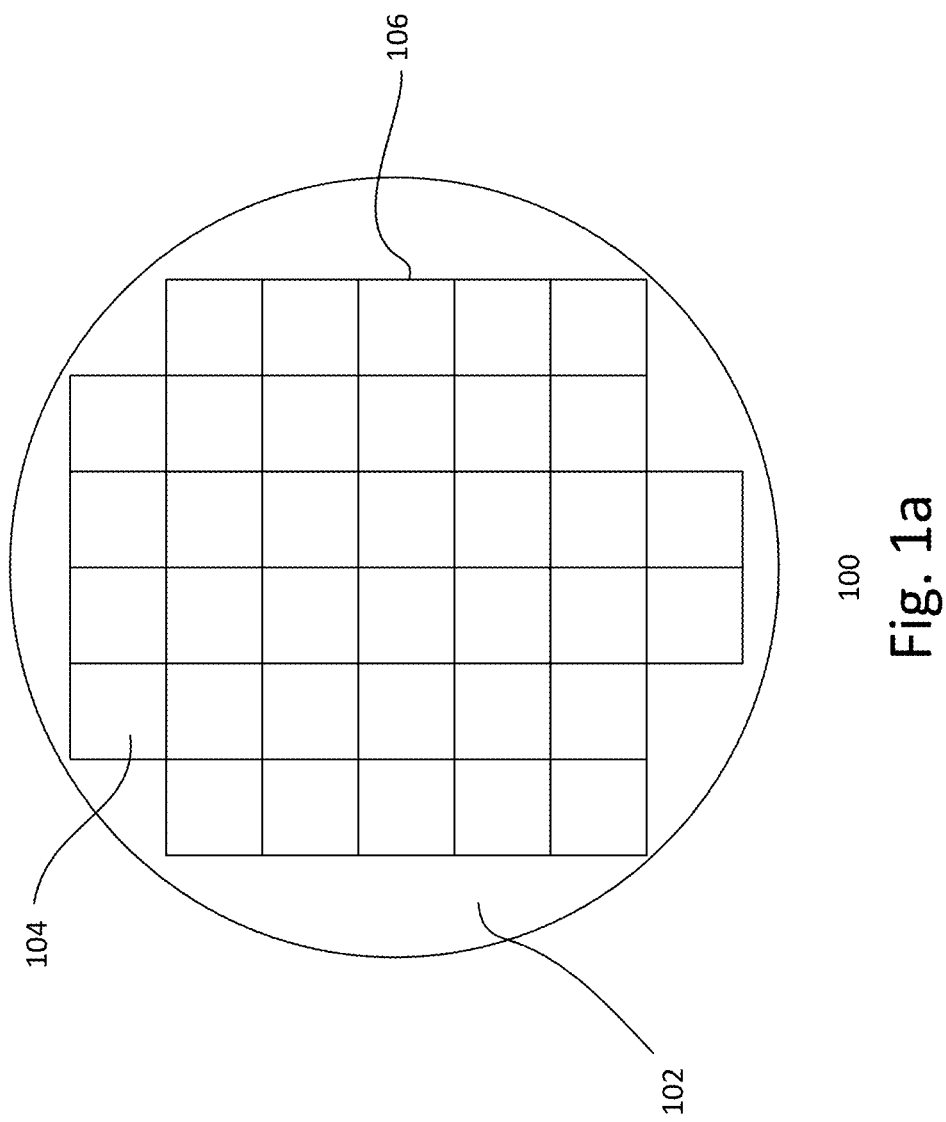

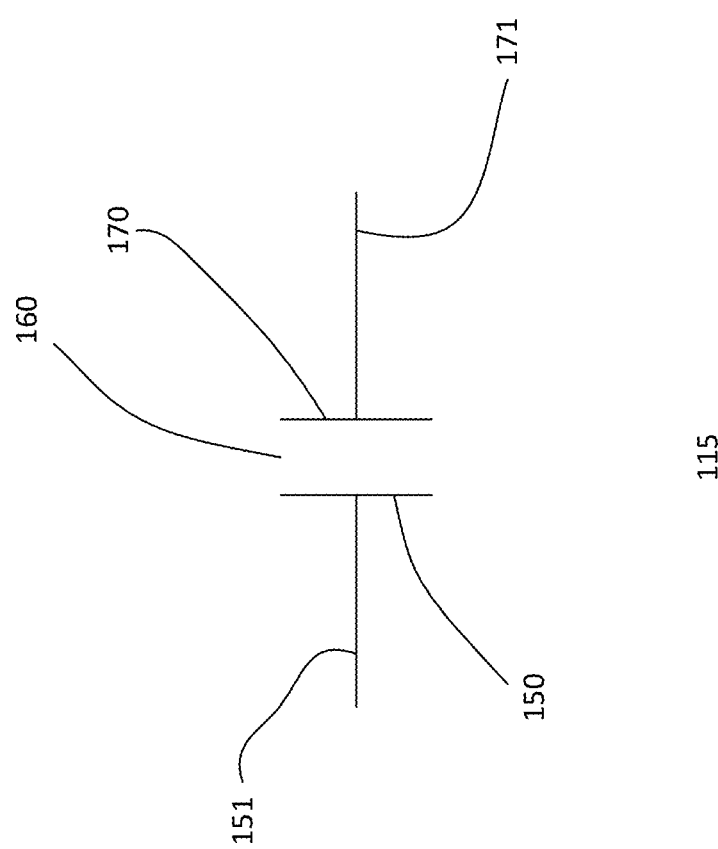

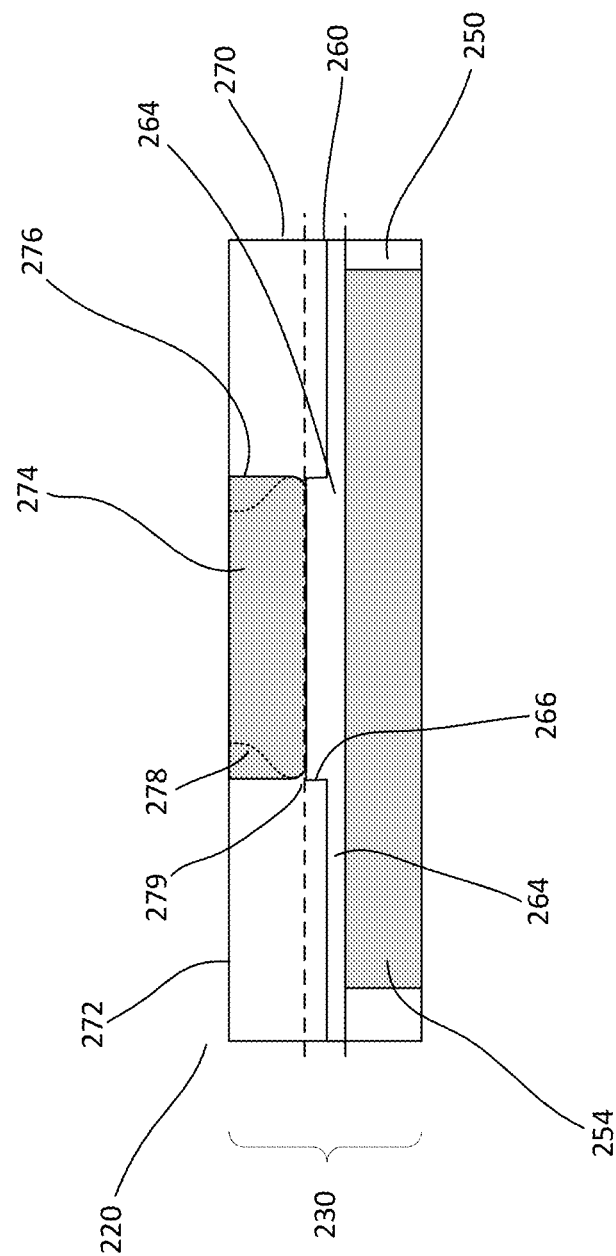

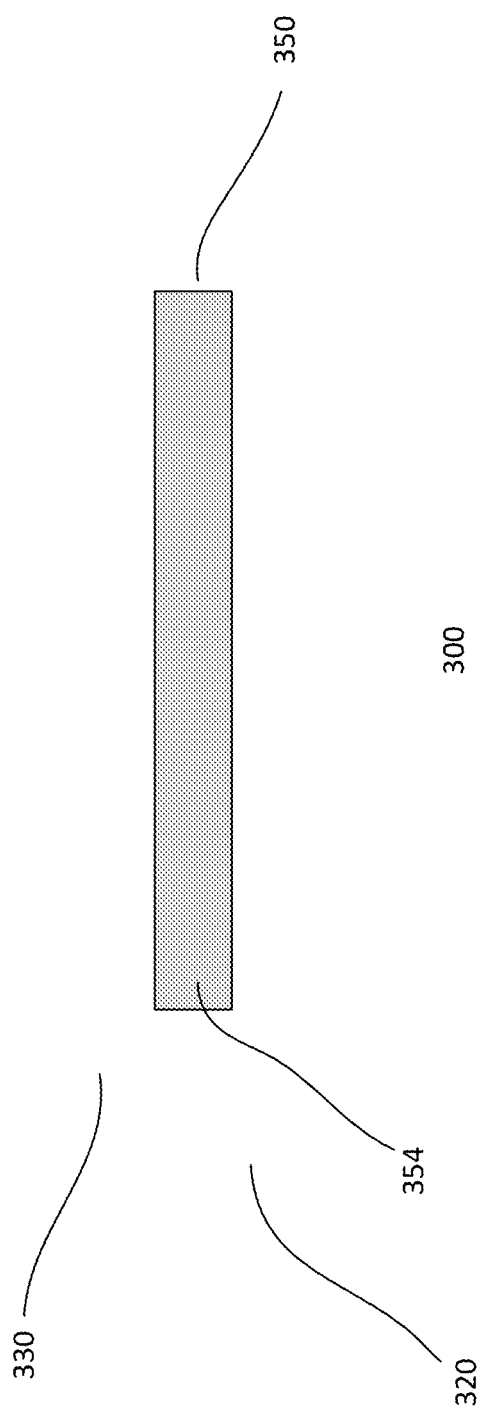

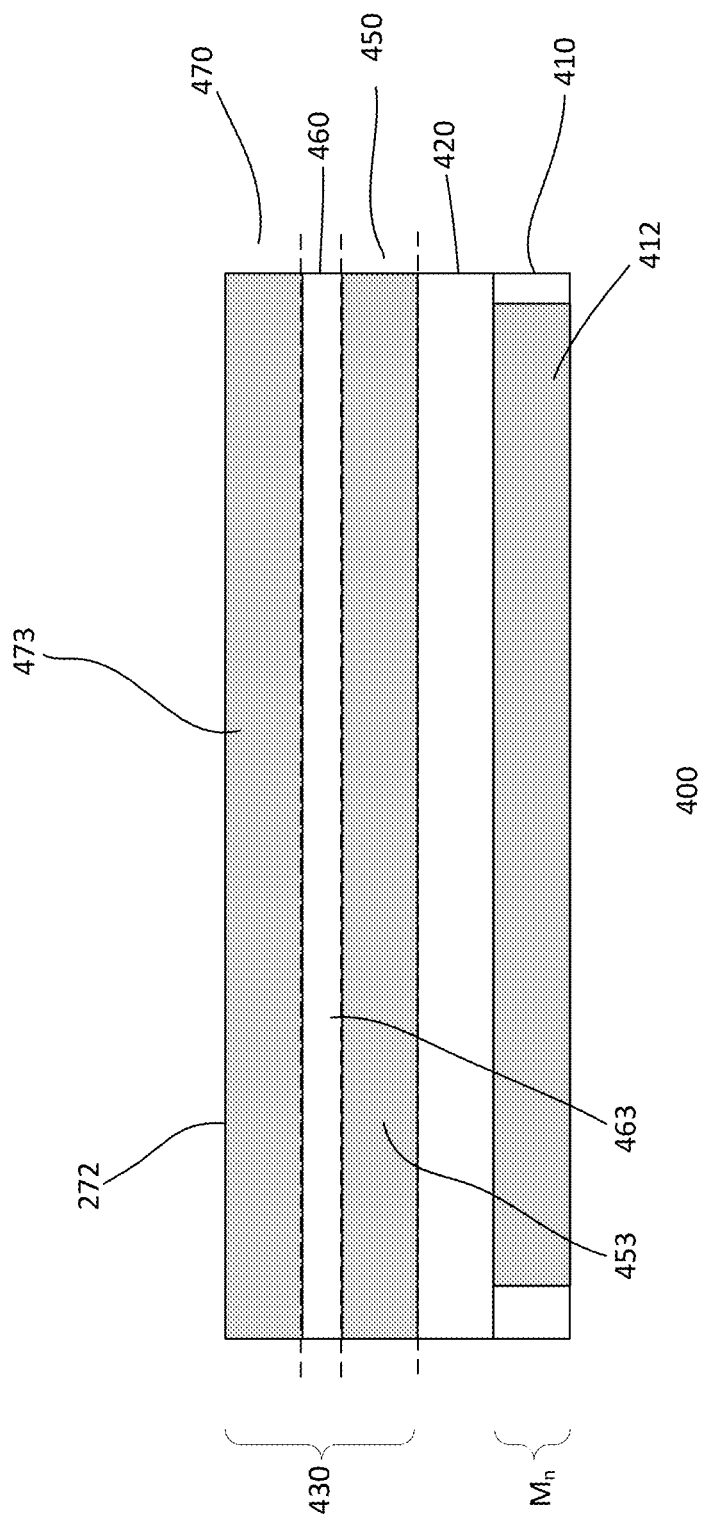

METAL-INSULATOR-METAL CAPACITOR WITH IMPROVED TIME-DEPENDENT DIELECTRIC BREAKDOWN

BACKGROUND

Capacitors are widely used in integrated circuits (ICs). One type of capacitors is a metal insulator metal (MIM) capacitor. A MIM capacitor has a capacitor dielectric disposed between capacitor plates. MIM capacitors provide high performance in IC applications, such as radio frequency (RF) applications. However, conventional MIM capacitors have been found to have reliability issues. For example, conventional MIM capacitors with thin capacitor dielectrics suffer from time-dependent dielectric breakdown (TDDB) of the capacitor dielectric. TDDB renders the IC defective or hinders performance. Reliability issues undesirably leads to increased costs or decreased revenues.

The present disclosure relates to providing reliable MIM capacitors.

SUMMARY

Embodiments relates to devices with a MIM capacitor. In one embodiment, a device includes a MIM capacitor integrated into any interlevel dielectric (ILD) and in any combination within the ILD layer. The MIM capacitor includes a bottom capacitor electrode, a capacitor dielectric disposed on the bottom capacitor electrode and a top capacitor electrode stacked on the capacitor dielectric. The top capacitor electrode is etched in such a way that all corners and edges of the plane/surface in contact with the MIM capacitor dielectric are rounded. The electrodes are used to make contacts with ILD level situated above and below the device.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 1a shows a top view of a semiconductor wafer;
FIG. 1b shows a schematic diagram of a MIM capacitor;
FIG. 2a shows a simplified cross-sectional view of an embodiment of a MIM capacitor;
FIGS. 3a-3g show a simplified cross-sectional view of an embodiment of a process for forming a MIM capacitor;
and
FIGS. 4a-4c show a simplified cross-sectional view of an embodiment of a process for forming another MIM capacitor.

DETAILED DESCRIPTION

Figure 2B:
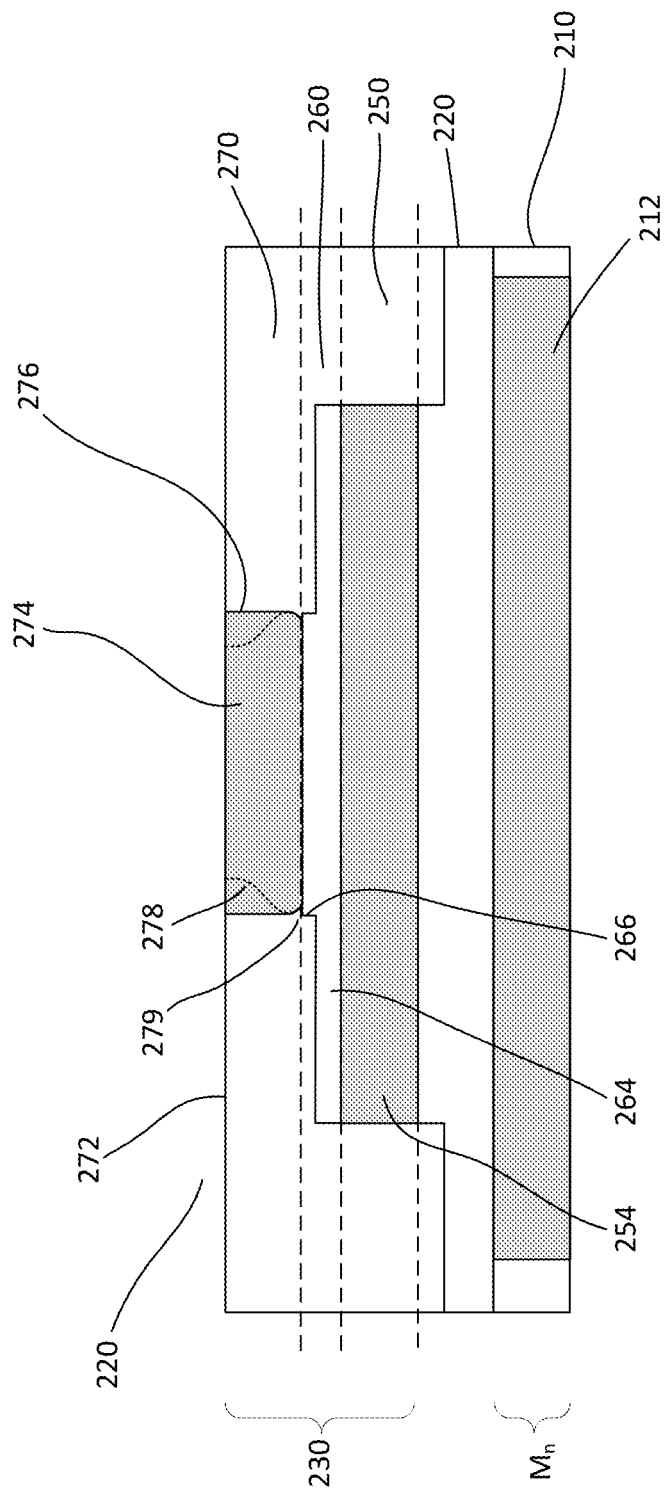
FIG. 2b shows a simplified cross-sectional view of another embodiment of a MIM capacitor.

Embodiments generally relate to devices, for example, semiconductor devices or integrated circuits (ICs). More particularly, embodiments relate to ICs with a capacitor. The capacitor includes, for example, a top plate of a capacitor with rounded corners and edges to improve TDDB. The capacitor may be a metal-insulator-metal (MIM) capacitor. The ICs can be any type of ICs, such as dynamic or static random access memories, signal processors, microcontrollers or system-on-chip (SoC) devices. Other types of devices may also be useful. The devices or ICs can be incorporated into or used with, for example, consumer electronic products, or other types of products.

The fabrication of devices may involve the formation of features on a substrate that make up circuit components, such as transistors, resistors and capacitors. The circuit components are interconnected, enabling the IC to perform the desired functions. To form the features and interconnections, layers are repeatedly deposited on the substrate and patterned as desired using lithographic techniques. For example, the substrate is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes.

FIG. 1a shows a simplified plan view of an embodiment of a semiconductor wafer 100. The semiconductor wafer, for example, may be a silicon wafer. The wafer may be a lightly doped p-type wafer. Other types of wafers, such as silicon-on-insulator (SOI), or silicon germanium (SiGe) wafer, as well as doped wafers with other types of dopants or dopant concentrations may also be useful.

The wafer includes an active surface 102 on which devices or ICs 104 are formed. A plurality of devices may be formed on the wafer in parallel. The devices, for example, are arranged in rows along a first (x) direction and columns along a second (y) direction. Wafer dicing process is then performed. When the process is completed, the wafer is diced along the dicing channels 106 to singulate the devices into individual chips.

The process of forming a device, such as an IC, may include providing a substrate. The substrate, as discussed, may be a wafer on which a plurality of devices are formed in parallel. The substrate of the device, for example, may include various types of regions. Such regions, for example, may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors. Other types of components or device regions may also be useful. For example, the device may include a memory region in which memory cells are formed.

Front-end-of-line (FEOL) Processing is performed on the substrate. For example, isolation regions are formed to isolate different device regions. The isolation regions, for example, are shallow trench isolation (STI) regions. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, forming gate oxide layer, such as thermal silicon oxide followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, a HV transistor will have a thicker gate dielectric than a LV transistor.

The gate layers, in one embodiment, may be formed on the active surface of the substrate. After the gate layers are formed on the active surface of the substrate, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming the lightly doped regions. Separate implants may be employed to form different doped regions using, for example, implant masks, such as photoresist mask.

After forming the transistors, back-end-of-line (BEOL) processing is performed. The BEOL process includes forming interconnects in a BEOL dielectric layer. The BEOL dielectric includes a plurality of interlevel dielectric (ILD) levels. The interconnects connect the various components of the IC to perform the desired functions. An ILD level includes a metal level dielectric and a contact level dielectric. The metal level dielectric includes conductors or metal lines while the contact level dielectric includes via contacts. The conductors and contacts may be formed of a metal, such as copper (Cu), copper alloy, aluminum (Al), tungsten (W) or a combination thereof. Other suitable types of metal, alloys or conductive materials may also be useful.

In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

As discussed, a device may include a plurality of ILD layers or levels. For example, x number of ILD levels may be provided. For example, 5 ILD levels (x=5) may be provided. Other number of ILD levels may also be useful. The number of ILD levels may depend on, for example, design requirements or the logic process involved. A metal level dielectric of an ILD level may be referred to as $M_i$, where i is the $i^{th}$ ILD level of x ILD levels. A contact level dielectric of an ILD level may be referred to as $V_{i-1}$, where i is the $i^{th}$ ILD level of x ILD levels. For the first contact level, it may be referred to as CA.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a pre-metal dielectric (PMD) layer or first contact level of the BEOL process. The dielectric layer may be referred to as CA level dielectric of the BEOL process. Contacts are formed in the CA level dielectric. The contacts may be formed by a single damascene process. Via openings are formed in the dielectric layer using mask and etch techniques. For example, a pattern resist mask with openings corresponding to the vias is formed over the dielectric layer. An anisotropic etch, such as RIE, is performed to form the vias, exposing contact regions below, such as S/D regions and gates. A conductive layer, such as tungsten (W) is deposited on the substrate, filling the openings. The conductive layer may be formed by sputtering. Other techniques may also be useful. A planarization process, such as CMP, is performed to remove excess conductive material, leaving contact plugs in the CA level dielectric.

After forming contacts in the CA level, the BEOL process continues to form a metal level dielectric layer over the substrate, covering the CA level dielectric layer. The dielectric layer, for example, serves as a first metal level dielectric $M_1$ of the first ILD level. The dielectric layer, for example, is a silicon oxide layer. Other types of dielectric layers may also be useful. The dielectric layer may be formed by CVD. Other techniques for forming the dielectric layer may also be useful.

Conductive lines are formed in the $M_1$ level dielectric. The conductive lines may be formed by a damascene technique. For example, the dielectric layer may be etched to form trenches or openings using, for example, mask and etch techniques. A conductive layer is formed on the substrate, filling the openings. For example, a Cu or Cu alloy layer may be formed to fill the openings. The conductive material may be formed by, for example, plating, such as electro or electro-less plating. Other types of conductive layers or forming techniques may also be useful. The first metal level dielectric $M_1$ and the via level dielectric CA may be referred as the first ILD level.

The process continues to form additional ILD levels. For example, the process continues to form ILD levels 2–x. In the case where x=5 (5 levels), the additional ILD levels include ILD levels from 2 to 5, which includes $M_2$ to $M_5$. The number of ILD levels may depend on, for example, design requirements or the logic process involved. The metal level dielectric layers and contact level dielectric layers of the ILD levels may be formed of silicon oxide (SiO). Other types of dielectric materials, such as low k, high k or a combination of dielectric materials may also be useful. The dielectric layers of the ILD levels may be formed by, for example, CVD. Other techniques for forming the dielectric layers of the ILD levels may also be useful.

The conductors and contacts of the additional ILD levels may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as Cu or Cu alloy. The conductive layer may be formed by, for example, plating techniques. Excess conductive material is removed, forming conductor and contacts in an ILD level.

A dielectric liner may be disposed between ILD levels and on the substrate. The dielectric liner, for example, serves as an etch stop layer. The dielectric liner may be formed of a low k dielectric material. For example, the dielectric liner may be a nitrogen doped barrier low k layer, such as NBLoK. Other types of dielectric materials for the dielectric liner may also be useful.

The upper ILD levels may have different design rules, such as critical dimension (CD), from the lower ILD levels. The upper ILD levels may include x and (x−1) ILD levels ($ILD_{x-1}$ and $ILD_x$). The upper ILD levels may include other ILD levels. As an example, the upper metal levels $M_{x-1}$ and $M_x$ may have a larger CD than the lower metal levels $M_1$ to $M_{x-2}$. The upper metal levels may have a CD which is 2× or 6× the CD of the lower metal levels. The upper metal levels may be referred to as the fat metal levels. Other configurations of metal levels of the ILD levels may also be useful.

The process described is an illustrative process flow. Other processes may be included or modified based on the IC formed. For example, processes may be included or modified to form non-volatile memory (NVM) cells in the array region. Additional or other processes may be included. For example, additional processes related to forming a pad layer with pad interconnects, pad opening, final passivation and packaging processes may be included. Furthermore, a plurality of ICs may be formed on the substrate or wafer in parallel.

Above the ILD level x is a pad level. The pad level includes contact pads. The contact pads, for example, provide external connections to the device. The pad contacts, for example, may be aluminum (Al) contacts and formed by RIE technique. For example, a pad contact layer, such as Al, is formed over the $M_x$ dielectric. The pad contact layer is patterned by a RIE etch process, such as RIE, and patterned to form the contact pads. A passivation layer may be formed over the $M_x$ dielectric and pad contacts. Openings are formed to expose the pad contacts.

FIG. 1b shows a schematic diagram of a capacitor 115 of a device. The capacitor includes a first metal capacitor electrode or plate 150 and a second capacitor metal electrode or plate 170 with a capacitor dielectric 160 therebetween. For example, the first capacitor plate may be referred to as a bottom plate and the second plate may be referred to as the top plate. A first capacitor terminal 151 is coupled to the first plate and a second terminal 171 is coupled to the second plate. The capacitance of the capacitor, in general, depends on various factors, such as materials, common surface area of the capacitor plates and thickness of the capacitor dielectric. To increase flexibility, a plurality of capacitors may be coupled to tailor the desired capacitance of the overall capacitor. For example, capacitors may be coupled in parallel, in series or a combination of both to tailor the desired capacitance of the overall capacitor.

FIG. 2a shows a cross-sectional view of a simplified embodiment of a capacitor 200a. The capacitor, in one embodiment, is a MIM capacitor. The capacitor may be integrated into an IC.

The MIM capacitor is disposed in a capacitor level 230. In one embodiment, a BEOL dielectric 220 of a device includes a capacitor level. As discussed, the BEOL dielectric is disposed on a substrate prepared with FEOL circuit components, such as transistors. The BEOL includes a plurality of ILD levels with metal lines or interconnects and contacts to form interconnections of the FEOL circuit components. The capacitor level may be disposed between two metal levels. Preferably, the capacitor level is disposed between two adjacent metal levels. For example, the capacitor level is disposed between $M_n$ and $M_{n+1}$ levels of $ILD_n$ and $ILD_{n+1}$. Providing a capacitor level between two non-adjacent metal levels may also be useful. In one embodiment, n is less than x. Other values of n may also be useful. $ILD_n$ includes metal level $M_n$ and via level $V_{n-1}$ and $ILD_{n+1}$ includes metal level $M_{n+1}$ and via level $V_n$.

In one embodiment, the capacitor level may include one or both of the metal levels $M_n$ and $M_{n+1}$. For example, between capacitor levels, there may be used to connote inclusion or exclusion of one or both of the metal levels $M_n$ and $M_{n+1}$. In one embodiment, the capacitor level includes $M_n$ and part of $V_n$. For example, the capacitor level includes $M_n$ of $ILD_n$ and part of $V_n$ of $ILD_{n+1}$. In other embodiments, the capacitor level is disposed within $V_n$ of $ILD_{n+1}$ above $M_n$ and below $M_{n+1}$. Other configurations of capacitor levels and ILD levels may also be useful.

The capacitor level, as shown, includes bottom and top capacitor electrode levels 250 and 270 with a capacitor dielectric level 260 therebetween, as indicated by the dotted lines. The various levels of the capacitor level may include one or more dielectric fill layers 272. The dielectric fill layers, for example, may be similar or the same as the ILD levels of the BEOL dielectric. For example, the fill layers may be silicon oxide fill layers. Other types of dielectric fill layers may also be useful.

In one embodiment, the bottom capacitor electrode level part of metal level $M_n$ and the capacitor dielectric level and top capacitor electrode level are separate capacitor levels from the BEOL dielectric. The separate capacitor levels, for example, are additional levels over the BEOL dielectric. The capacitor dielectric level and top capacitor level are disposed over the bottom capacitor level and may be part of the via level $V_n$ of $ILD_{n+1}$ level. For example, the dielectric fill layer of the bottom capacitor level may be part of the metal level dielectric of $M_n$ and the fill layer of the top capacitor electrode level and the capacitor dielectric of the capacitor dielectric level may be part of via level dielectric of $V_n$. Other configurations of the fill layer may also be useful.

The bottom capacitor electrode level includes a bottom capacitor electrode 254. The bottom capacitor electrode may be a metal electrode. Since the bottom capacitor electrode is part of the $M_n$ dielectric, it includes the same material as the metal lines of $M_n$. For example, the bottom capacitor electrode may be a Cu or Cu alloy bottom capacitor electrode. In other embodiments, the bottom electrode level may be a separate capacitor level from $M_n$. For example, the bottom electrode level may be an additional level of the BEOL dielectric which is disposed above $M_n$ within $V_n$. The bottom electrode level may be isolated from $M_n$ by a bottom electrode isolation level, which includes an isolation dielectric layer, such as silicon oxide. The bottom electrode isolation level may be an additional level of the BEOL dielectric. Other types of isolation dielectric layers may also be useful. In such cases, the capacitor electrode may be formed of different conductive materials and thicknesses from the metal lines of $M_n$. For example, the bottom electrode may be a tantalum (Ta) electrode. Other types of bottom electrodes, such as tantalum nitride (TaN) may also be useful.

A capacitor dielectric 264 is disposed in the capacitor dielectric level above the bottom capacitor electrode level. As discussed, the capacitor dielectric level is an additional level of the BEOL dielectric. As such, the capacitor dielectric can be tailored with the desired thickness and material. In one embodiment, the capacitor dielectric is a silicon nitride (SiN) capacitor dielectric. Other types of capacitor dielectrics, such as high k dielectrics or NBLoK, may also be useful. The thickness of the capacitor dielectric may be, for example, is less than about 30 nm. Other thicknesses may also be useful.

A top capacitor electrode 274 is disposed in the top capacitor electrode level above the capacitor dielectric level. In one embodiment, as discussed, the top capacitor level, like the capacitor dielectric level, is an additional level in the BEOL dielectric. As such, the top capacitor electrode may include a different type of conductive material than the BEOL lines. In one embodiment, the top capacitor electrode may be a Ta electrode. Providing other types of capacitor electrodes, such as TaN, may also be useful. In other embodiments, the top capacitor electrode may be formed of the same type of material as the metal lines of the metal levels, such as Cu or Cu alloy. It is also understood that the top and bottom electrodes need not to be formed of the same material.

As shown, the bottom electrode is larger or wider than the top electrode. For example, the bottom electrode encompasses the top electrode. Providing a bottom electrode which is larger than the top electrode advantageously enables contacts to be provided to the top and bottom electrodes form ILD levels above. The electrodes may be formed by different patterning process. For example, the bottom electrode and top electrode formed using separate etch processes. The top capacitor electrode may be formed by separate patterning process than the bottom capacitor electrode. In one embodiment, the bottom capacitor electrode may be formed in the same process for forming $M_n$ metal lines while the top capacitor electrode is formed by a separate patterning process. In one embodiment, an over-etch of the top capacitor electrode is performed to remove a portion of the capacitor dielectric layer. The over-etch forms a step 266 in the capacitor dielectric layer. The over-etch ensures complete patterning of the top capacitor electrode. Other configurations of the capacitor electrodes may also be useful. For example, the capacitor electrodes may be the same size or the bottom capacitor electrode may be smaller than the top capacitor electrode. In such cases, contact to the bottom electrode may be from $ILD_{n-1}$ level below. The capacitance of the capacitor depends on the area of the overlap between the electrodes and thickness of the capacitor dielectric.

In one embodiment, the top capacitor electrode of the MIM capacitor includes rounded edges 279 at the interface of the top capacitor electrode and the capacitor dielectric. For example, a lower portion of the top capacitor electrode has rounded edges. In one embodiment, edges at the interface of the top capacitor electrode and the capacitor dielectric are rounded. For the case of a rectangular shaped electrode, the four edges are rounded. Other shaped electrodes may also be useful. The rounded edges, for example, may be formed using different etch rates between different materials of the capacitor electrodes and the capacitor dielectric of the MIM capacitor which will be discussed in more detail later.

In one embodiment, the top capacitor electrode has vertical sidewalls in the upper portion and rounded edges in the lower portion at the interface. The vertical sidewalls are achieved using, for example, an anisotropic etch, such as a reactive ion etch (RIE). The etch chemistry is selective to the capacitor dielectric layer. For example, the etch rate of the capacitor electrode is higher than the capacitor dielectric.

In some embodiments, the top capacitor electrode has pear-shaped sidewalls, as shown by dotted lines 278. The pear-shaped profile, for example, may be achieved using an isotropic etch which selectively etches the electrode material. For example, the etch rate of the electrode is higher than the capacitor dielectric.

The capacitor electrodes may include contacts (not shown) which are coupled to metal levels of the BEOL above and/or below the capacitor level. For example, a bottom capacitor contact may be coupled to the bottom capacitor electrode and a top capacitor contact may be coupled to the top capacitor electrode. In other embodiments, contacts are provided for top and bottom electrodes which connect to ILD levels above.

As described, the MIM capacitor includes rounded edges at the interface of the top capacitor electrode and capacitor dielectric. By providing rounded edges, the electric field at the interface is reduced. The reduced electric field at the interface reduces TDDB, improving reliability. This is particularly useful for capacitor dielectrics which are susceptible to breakdown. For example, thin capacitor dielectrics, such as those which are less than about 30 nm, are susceptible to breakdown. Providing rounded corners for the top capacitor electrode and capacitor dielectrics having other thicknesses may also be useful.

FIG. 2b shows a simplified cross-sectional view of another embodiment of a capacitor 200b. The capacitor may be integrated into an IC, such as previously described in FIG. 2a. Common elements may not be described or described in detail.

As shown, the MIM capacitor is disposed in a capacitor level 230 above a metal level 210. The metal level, for example, may be $M_n$ with one or more metal lines 212, such as Cu or Cu alloy lines. For example, the capacitor level is disposed within via level $V_n$ of $ILD_{n+1}$. The capacitor level, as shown, is isolated from $M_n$ by a capacitor isolation level 220. The capacitor isolation level includes an isolation dielectric layer, such as silicon oxide. The thickness of the isolation dielectric layer, for example, may be 60 nm. Other thicknesses may also be useful. The isolation and capacitor levels may be additional levels of the BEOL dielectric.

The capacitor level includes bottom and top capacitor electrode levels 250 and 270 separated by a capacitor dielectric level 260. The various levels of the capacitor level may include one or more dielectric fill layers 272. In one embodiment, a dielectric fill layer is provided over the capacitor isolation layer. The dielectric fill layer, for example, may be the same or similar to the ILD levels of the BEOL dielectric. For example, the fill layer may be a silicon oxide fill layer. Other types of dielectric fill layers may also be useful.

The bottom capacitor electrode level includes a bottom capacitor electrode 254. The bottom capacitor electrode may be a metal electrode. Since the bottom capacitor electrode level is an addition level of the BEOL dielectric, it may include a conductive material which is different from the ILD levels. In one embodiment, the bottom electrode may be a Ta electrode. Other types of bottom electrodes, such as tantalum nitride (TaN), may also be useful.

A capacitor dielectric 264 is disposed in the capacitor dielectric level above the bottom capacitor electrode level. As discussed, the capacitor dielectric level is an additional level of the BEOL dielectric. As such, the capacitor dielectric can be tailored with the desired thickness and material. In one embodiment, the capacitor dielectric is a silicon nitride (SiN) capacitor dielectric. Other types of capacitor dielectrics, such as high k dielectrics or NBLoK, may also be useful. The thickness of the capacitor dielectric may be, for example, is less than about 30 nm. Other thicknesses may also be useful.

A top capacitor electrode 274 is disposed in the top capacitor electrode level above the capacitor dielectric level. In one embodiment, as discussed, the top capacitor level, like the capacitor dielectric level, is an additional level in the BEOL dielectric. As such, the top capacitor electrode may include a different type of conductive material than the BEOL lines. In one embodiment, the top capacitor electrode may be a Ta electrode. Providing other types of capacitor electrodes, such as TaN, may also be useful. In other embodiments, the top capacitor electrode may be formed of the same type of material as the metal lines of the metal levels, such as Cu or Cu alloy. It is also understood that the top and bottom electrodes need not to be formed of the same material.

As shown, the bottom electrode is larger or wider than the top electrode. For example, the bottom electrode encompasses the top electrode. Providing a bottom electrode which is larger than the top electrode advantageously enables contacts to be provided to the top and bottom electrodes form ILD levels above. The electrodes may be formed by different patterning process. For example, the bottom electrode and top electrode formed using separate etch processes. The top capacitor electrode may be formed by a separate patterning process from the one used to form the bottom capacitor electrode. In one embodiment, an over-etch of the top capacitor electrode is performed to remove a portion of the capacitor dielectric layer. The over-etch forms a step 266 in the capacitor dielectric layer. The over-etch ensures complete patterning of the top capacitor electrode. Other configurations of the capacitor electrodes may also be useful. Similarly, the bottom electrode is over-etched to ensure complete patterning of the bottom capacitor electrode. For example, the capacitor electrodes may be the same size or the bottom capacitor electrode may be smaller than the top capacitor electrode. In such cases, contact to the bottom electrode may be from $ILD_{n-1}$ level below. The capacitance of the capacitor depends on the area of the overlap between the electrodes and thickness of the capacitor dielectric.

In one embodiment, the top capacitor electrode of the MIM capacitor includes rounded edges 279 at the interface of the top capacitor electrode and the capacitor dielectric. For example, a lower portion of the top capacitor electrode has rounded edges. In one embodiment, edges at the interface of the top capacitor electrode and the capacitor dielectric are rounded. For the case of a rectangular shaped electrode, the four edges are rounded. Other shaped electrodes may also useful. The rounded edges, for example, may be formed using different etch rates between different materials of the capacitor electrodes and the capacitor dielectric of the MIM capacitor which will be discussed in more detail later.

In one embodiment, the top capacitor electrode has vertical sidewalls in the upper portion and rounded edges in the lower portion at the interface. The vertical sidewalls are achieved using, for example, an anisotropic etch, such as a reactive ion etch (RIE). The etch chemistry is selective to the capacitor dielectric layer. For example, the etch rate of the capacitor electrode is higher than the capacitor dielectric.

In some embodiments, the top capacitor electrode has pear-shaped sidewalls, as shown by dotted lines 278. The pear-shaped profile, for example, may be achieved using an isotropic etch which selectively etches the electrode material. For example, the etch rate of the electrode is higher than the capacitor dielectric.

Since the isolation dielectric is relatively thick compare to the capacitor dielectric, TDDB is not a concern. However, should TDDB be a concern, the bottom electrode may include rounded corners, similar to the top capacitor electrode.

The capacitor electrodes may include contacts (not shown) which are coupled to metal levels of the BEOL above and/or below the capacitor level. For example, a bottom capacitor contact may be coupled to the bottom capacitor electrode and a top capacitor contact may be coupled to the top capacitor electrode. In other embodiments, contacts are provided for top and bottom electrodes which connect to ILD levels above.

As described, the MIM capacitor includes rounded edges at the interface of the top capacitor electrode and capacitor dielectric. By providing rounded edges, the electric field at the interface is reduced. The reduced electric field at the interface reduces TDDB, improving reliability. This is particularly useful for capacitor dielectrics which are susceptible to breakdown. For example, thin capacitor dielectrics, such as those which are less than about 30 nm, are susceptible to breakdown. Providing rounded corners for the top capacitor electrode for capacitor dielectrics having other thicknesses may also be useful.

In some embodiments, a resistor level may be provided, as already discussed with respect to FIG. 2a. The resistor level, for example, may be part of the top capacitor electrode level and/or bottom capacitor electrode level. Providing a resistor level which is separate from the capacitor electrode levels may also be useful.

FIGS. 3a-3g show cross-sectional views illustrating an embodiment of a process for forming a MIM capacitor of a device or IC. The MIM capacitor is similar to that described in FIG. 2a. In the interest of brevity, common elements may not be described or described in detail.

For simplicity, the processing of a substrate to form transistors using FEOL and processing of lower ILD level and lower levels of an upper ILD using BEOL are not shown. Referring to FIG. 3a, a bottom electrode level of a capacitor level 330 disposed in a BEOL dielectric 320. The bottom capacitor level includes a dielectric layer. For example, the dielectric layer may be a silicon oxide layer. Other types of dielectric layers may also be used. The dielectric layer may be formed by, for example, chemical vapor deposition (CVD). Other techniques for forming the dielectric layer may also be useful. As shown, a bottom capacitor electrode 350 is formed in the bottom capacitor dielectric layer. The bottom capacitor electrode layer may be a metal bottom electrode 354, such as Cu or Cu alloy.

The bottom capacitor electrode may be formed by various techniques. For example, the bottom capacitor electrode may be formed by damascene technique. A damascene technique includes patterning the dielectric layer of bottom capacitor electrode level to form a trench in which the bottom capacitor electrode is formed. Patterning the dielectric layer may be achieved with mask and etch techniques. For example, a photoresist layer may be deposited on the dielectric layer and exposed using lithography, such as with an exposure source through a reticle with the desired pattern. The resist is developed, transferring the pattern of the reticle to the resist. For example, the pattern resist protects the dielectric layer except where the bottom electrode is to be formed. An antireflective coating (ARC) layer may be provided below the resist layer to improve lithographic resolution.

After forming the trench, a conductive layer is deposited on the substrate, filling the trench and covering the dielectric layer. The conductive layer may be formed by, for example, plating. The plating may include electro plating or electroless plating. Other techniques, such as sputtering, may also be useful. Excess conductive material is removed by, for example, chemical mechanical polishing (CMP). The polishing process forms the bottom electrode in the trench. The top surface of the bottom capacitor electrode and the top surface of the bottom capacitor level dielectric are coplanar.

In some embodiment, the bottom electrode may be formed by a dual damascene technique. For example, a bottom electrode contact via and bottom electrode trench may be formed in the dielectric layer. When the conductive layer is formed, it fills both the bottom electrode contact via and bottom electrode trench. Excess conductive material is removed by, for example, CMP. The polishing process forms the bottom electrode in the trench and capacitor via contact in the via. The top surface of the bottom capacitor electrode and the top surface of the bottom capacitor level dielectric are coplanar.

In another embodiment, the bottom electrode may be formed by a RIE technique. For example, a conductive layer is deposited on an underlying dielectric layer and patterned using, for example, mask and etch techniques to form the bottom electrode. A bottom capacitor level dielectric is deposited on the substrate, covering the underlying dielectric layer and the bottom capacitor electrode. Excess dielectric material is removed by, for example, CMP. The forms the bottom capacitor level dielectric with the bottom capacitor electrode which have coplanar top surfaces.

In one embodiment, the bottom electrode level is a metal level $M_n$ of $ILD_n$. In such case, the bottom electrode and bottom electrode dielectric include materials of a metal level or ILD level of the BEOL dielectric. For example, the bottom electrode level may be silicon oxide and the bottom electrode may be Cu or Cu alloy. Other configurations of the bottom electrode level may also be useful.

Figure 3B:
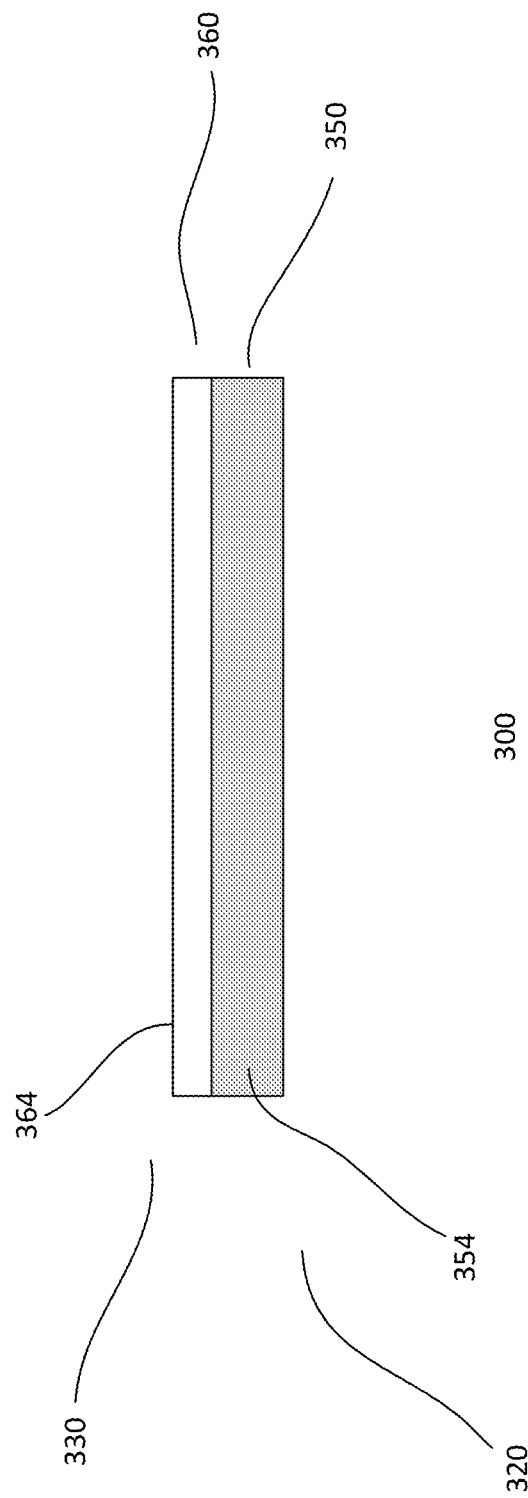

Referring to FIG. 3b, a capacitor dielectric 361 is formed over the bottom capacitor level dielectric. The capacitor dielectric is in the capacitor dielectric level 360. In one embodiment, the capacitor dielectric level is an additional level of the BEOL dielectric. In one embodiment, the capacitor dielectric is a SiN capacitor dielectric. Other types of capacitor dielectrics may also be useful. The capacitor dielectric is formed by, for example, CVD. Other techniques for forming the capacitor dielectric may also be useful. The thickness of the capacitor dielectric, for example, is tailored to produce the desired capacitance. The thickness, for example, may be about 30 nm. Other thicknesses may also be useful.

Figure 3C:
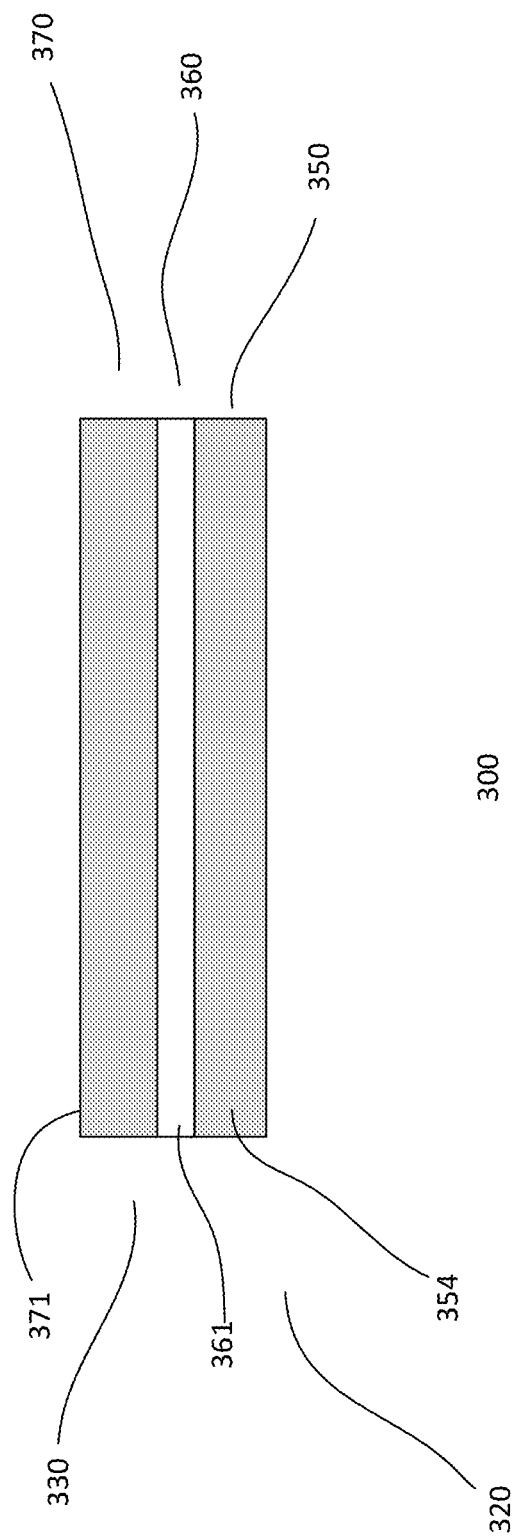

In FIG. 3c, a top capacitor electrode layer 371 is formed in the top capacitor level 370. The top capacitor electrode layer, for example, may be a conductive layer. The conductive layer may be a metal layer, such as a Ta-based layer. Other types of top capacitor electrode layers, such as TaN, as well as other types of conductive layers which are not a Ta-based layer, may also be useful. The top electrode conductive layer may be formed by, for example, physical vapor deposition (PVD). Other types of forming techniques, such as plating, may also be useful.

In one embodiment, the capacitor dielectric and top capacitor electrode levels are additional levels of the BEOL dielectric. The capacitor dielectric and top capacitor electrode layers are formed over the bottom electrode level as blanket layers. The capacitor dielectric and top capacitor level may be integrated into the via level $V_n$ of $ILD_{n+1}$.

Figure 3D:
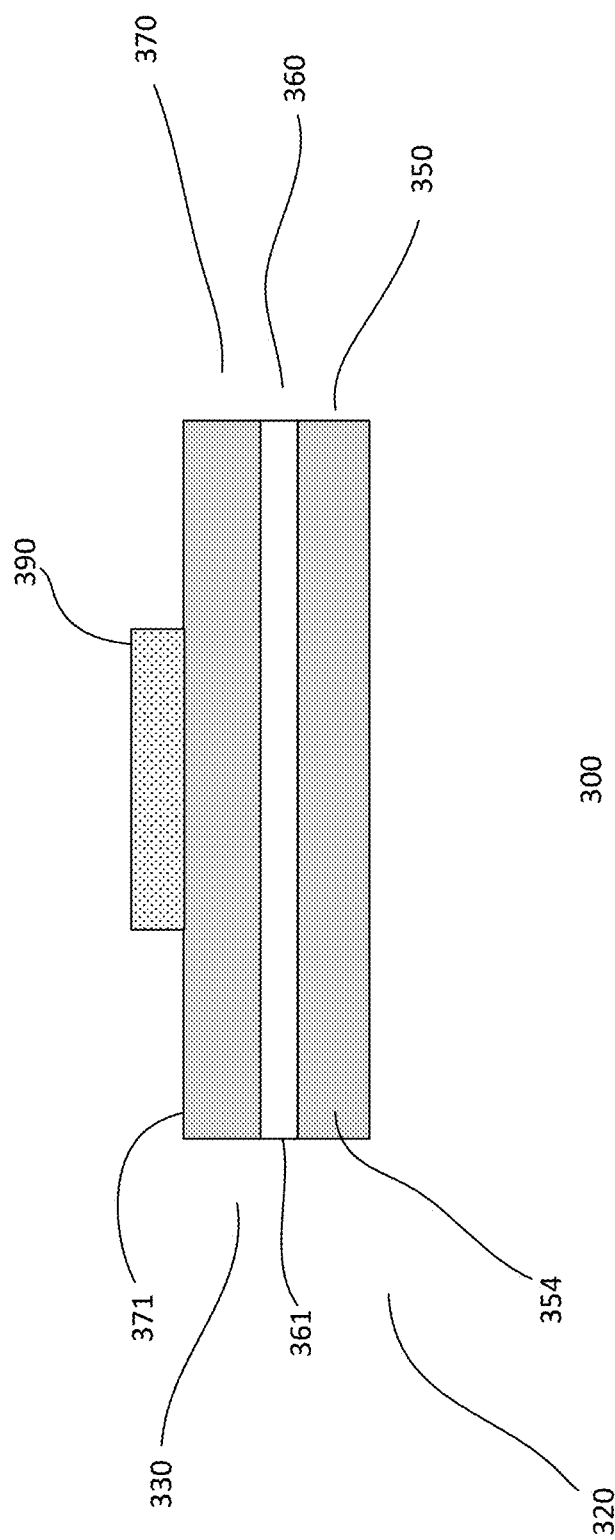

As shown in FIG. 3d, a resist layer 390 is formed on the surface of the substrate. For example, the resist layer is formed over the top electrode layer. The resist layer is patterned to expose portions of the top electrode layer to serve as an etch mask. For example, the resist layer corresponds to the top capacitor electrode. To pattern the resist layer, lithography is employed. For example, an exposure source is used to expose the resist layer through a reticle with the desired pattern. The resist is developed, transferring the pattern of the reticle to the resist. An ARC layer (not shown) may be provided below the resist layer to improve lithographic resolution. The ARC layer remains on the surface of the top electrode layer after resist development.

Figure 3E:
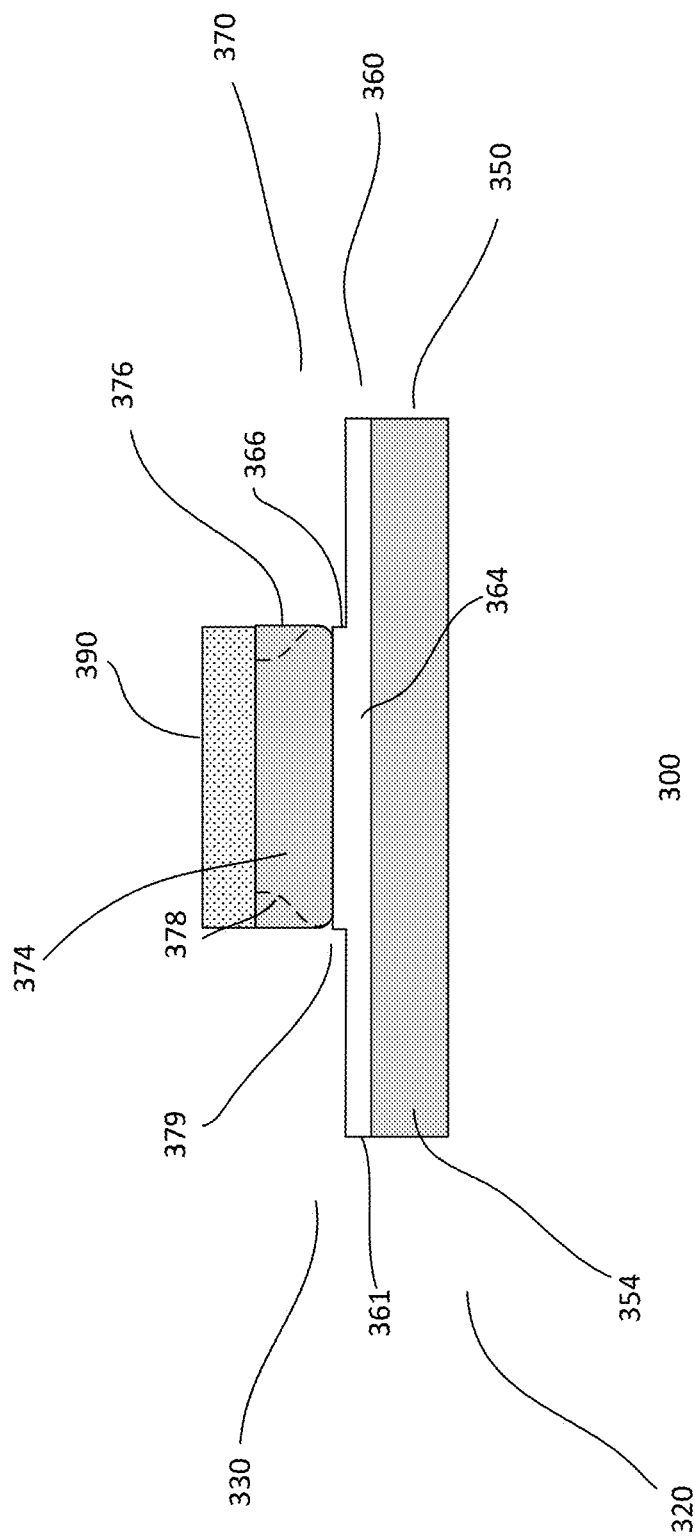

Referring to FIG. 3e, the top electrode layer is patterned to form a top capacitor electrode 374. In one embodiment, an anisotropic etch is employed to pattern the top capacitor electrode layer (including the ARC layer). The anisotropic etch, for example, is RIE. In one embodiment, the etch over-etches the top capacitor electrode layer, removing a portion of the capacitor dielectric layer to form a step 366. The portion of the capacitor dielectric layer under the top capacitor electrode serves as the capacitor dielectric 364. As shown, the etch forms a top capacitor electrode 374 having vertical sidewalls 376. The etch also forms a top capacitor electrode with rounded edges 379 at an interface with the capacitor dielectric layer.

In one embodiment, the etch process for patterning the top capacitor electrode is tailored to form the rounded edges at the interface with the capacitor dielectric layer. In one embodiment, the etch chemistry of the etch process is selective to the capacitor electrode. The etch chemistry may include chlorine ($Cl_2$), boron trichloride ($BCl_3$) and/or tetrafluoromethane ($CF_4$) that are selective to the capacitor dielectric. For example, selectively etching the metal with a higher etch rate as compared to the capacitor dielectric. Other etch chemistries which selectively etches the electrode compared to the capacitor dielectric may also be useful. Etching the top capacitor electrode layer selectively along with tailoring the power and pressure results in the top electrode having rounded edges. For example, the etch chemistry, power and pressure are tailored to provide increased isotropic etching (lateral etch) component to produce the rounded edges at an interface of the top capacitor electrode and capacitor dielectric.

In an alternative embodiment, an isotropic etch is employed to pattern the top electrode layer. The isotropic etch, for example, is a wet etch. Other types of etch processes may also be useful. The isotropic etch is selective to the capacitor dielectric. For example, the isotropic etch removes the capacitor electrode layer with a higher etch rate than the capacitor dielectric. In one embodiment, the isotropic etch forms a top capacitor electrode having pear-shaped sidewalls, as shown by dotted lines 378. In one embodiment, the etch forms a capacitor electrode with rounded edges 379 at the interface of the capacitor dielectric and capacitor electrode layer.

Figure 3F:
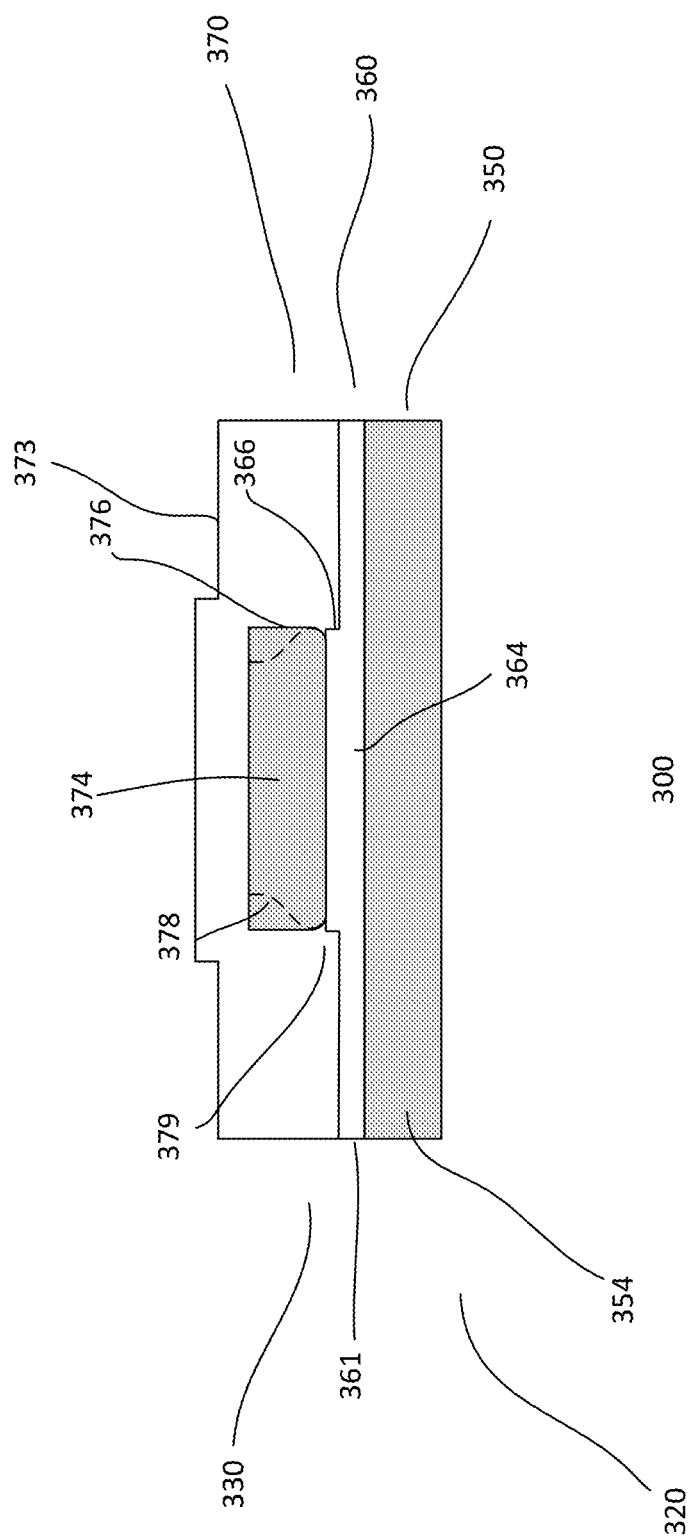

A capacitor level dielectric layer 373 is formed on the substrate in the capacitor level 370, as shown in FIG. 3f. The capacitor level dielectric layer sufficiently covers the exposed capacitor dielectric layer and top capacitor electrode. In one embodiment, the height of the capacitor dielectric layer over the capacitor dielectric layer should be higher than the top capacitor electrode. The top capacitor level dielectric layer, for example, is a silicon oxide layer formed by CVD. Other types of capacitor level dielectric layer may also be useful.

Figure 3G:
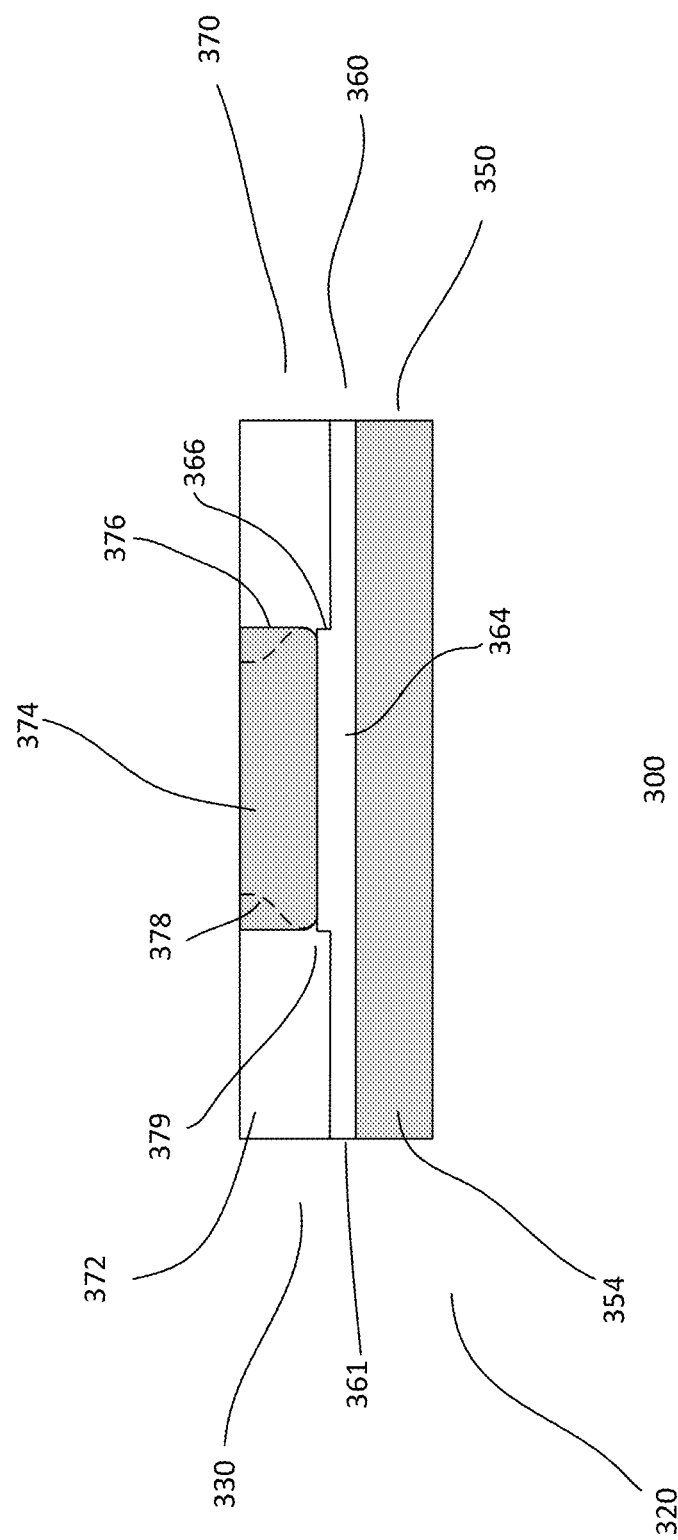

Referring to FIG. 3g, the substrate is subjected to a polishing process, such as CMP. The CMP removes excess dielectric material. The CMP forms coplanar top surfaces with the top capacitor level dielectric layer and the top capacitor electrode.

In other embodiments, the capacitor level dielectric layer may be sufficiently thick to serve as the via level dielectric layer of $V_n$. The dielectric layer may be polished by, for example, CMP, to form a planar surface of $V_n$ which is above the top capacitor level.

As described, the bottom capacitor electrode may be formed using various techniques, such as damascene, dual damascene or RIE while the top capacitor electrode is formed by RIE. Forming the top capacitor electrode by RIE facilitates forming a top capacitor electrode with rounded edges at the interface of the top capacitor electrode and the capacitor dielectric. The rounded edges improve TDDB, thereby improving reliability of the MIM capacitor.

Additional processes may be performed. For example, additional processes may include forming additional ILD levels, pad level and final passivation. Other processes may also be performed to complete the IC.

Figure 4B:
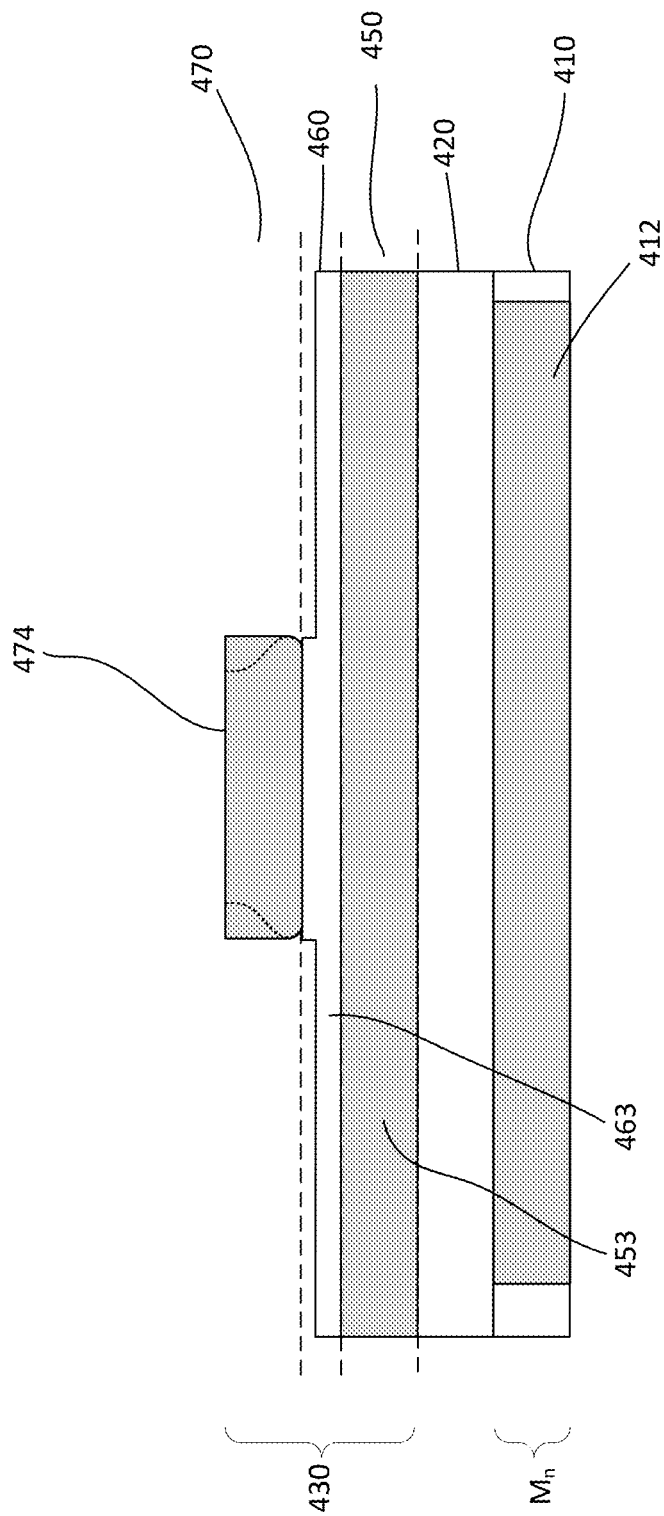
Figure 4C:
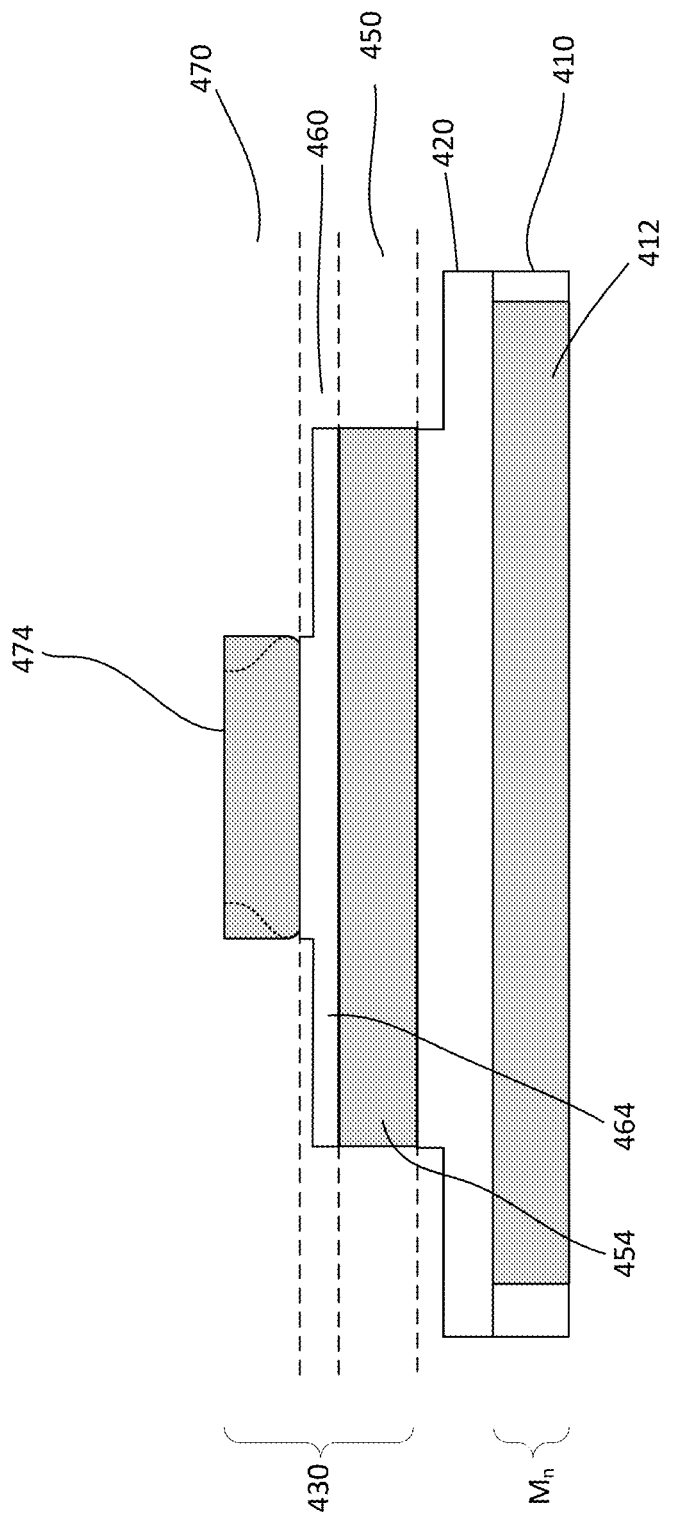

FIGS. 4a-4c show cross-sectional views illustrating another embodiment of a process for forming another MIM capacitor of a device or IC. The MIM capacitor is similar to that described in FIGS. 2a-2b and 3a-3g. In the interest of brevity, common elements may not be described or described in detail.

Referring to FIG. 4a, a substrate (not shown) is prepared with a metal level 410 of a BEOL dielectric. The metal level, for example is $M_n$ of $ILD_{n-1}$ of the BEOL dielectric. The metal level includes one or more metal lines 412.

In one embodiment, layers of the capacitor level 430 are formed on the substrate. The capacitor level layers are formed, for example, over $M_n$. In one embodiment, an isolation dielectric layer 420, such as silicon oxide, is formed on $M_n$ in a capacitor isolation level to isolate the capacitor level from $M_n$. The isolation dielectric layer may be formed by, for example, CVD. Other techniques or types of isolation dielectric layer may also be useful. The thickness of the isolation dielectric layer, for example, may be 60 nm. Other thicknesses may also be useful.

In one embodiment, the layers of the capacitor level include a bottom electrode layer 453 in a bottom electrode level 450, a capacitor dielectric layer 463 in a capacitor dielectric level 460 and a top capacitor electrode layer 473 in a top capacitor level 470. The capacitor layers may each include a Ta-based electrode layer. For example, the capacitor electrode layer may be a Ta layer. Other types of Ta-based layers, such as TaN or non-Ta based layers may also be useful. As for the capacitor dielectric layer, it may be a SiN capacitor dielectric layer. The various layers of the capacitor level may be formed by CVD, PVD, sputtering or other forming techniques. The forming technique may depend on the type of layer formed.

As shown in FIG. 4b, the top electrode layer of the capacitor level is patterned to form a top electrode 474. Patterning the top electrode may be achieved using mask and etch techniques, as previously described with respect to FIGS. 3a-3g. For example, the top electrode resist mask is employed for an anisotropic etch, such as RIE, to pattern the top electrode. An over-etched may be performed to ensure complete patterning of the top electrode layer and the etch forms rounded etches at the interface of the top electrode and capacitor dielectric layers. In other embodiments, the etch may formed a pear-shared top electrode capacitor sidewall profile, as indicated by the dotted lines.

As shown in FIG. 4c, the capacitor dielectric and bottom electrode layers are patterned to form a lower portion of the capacitor. The lower portion of the capacitor may be patterned by mask and etch techniques, similar to those already described, for example, with respect to patterning the top capacitor electrode layer. An over-etch may be performed to ensure complete patterning of the bottom capacitor electrode layer to form the bottom capacitor electrode.

As shown, the process of forming the bottom electrode does not form rounded edges. However, if TDDB breakdown of the capacitor isolation layer is a concern, the bottom electrode may be patterned to form a rounded or a pear-shaped sidewall profile, as previously described with respect to the top capacitor electrode.

Additional processes may be performed. For example, additional processes may include forming a capacitor level dielectric layer, additional ILD levels, pad level and final passivation. Other processes may also be performed to complete the IC.

The present disclosure may be embodied in other specific forms without departing from the spirit or essential characteristics thereof. Particularly, this technique aims to support the continued scaling of MIM capacitors so as to enhance its performance when used to make small, high performance MIM capacitors for future generations of IC technology. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
a substrate with circuit components;
a back-end-of-line (BEOL) dielectric layer having a plurality of interlevel dielectric (ILD) levels, wherein an ILD level includes a metal ILD level with metal lines and an ILD via contact ILD level with via contacts for interconnection with the circuit components; and
a capacitor level disposed between lower and upper metal levels of lower and upper ILD levels of the BEOL dielectric layer, wherein the capacitor level includes a capacitor, the capacitor comprises a bottom capacitor electrode, a capacitor dielectric disposed on the bottom capacitor electrode, and a top capacitor electrode disposed above the capacitor dielectric, and the top capacitor electrode comprises a sidewall profile with rounded corners at an interface of the top capacitor electrode and the capacitor dielectric.

2. The device of claim 1 wherein the bottom capacitor electrode comprises copper.

3. The device of claim 1 wherein the capacitor dielectric comprises silicon nitride.

4. The device of claim 1 wherein the top capacitor electrode comprises tantalum.

5. The device of claim 1 wherein the capacitor level is disposed within a via level dielectric $V_n$ above a metal level $M_n$ and below a metal level $M_{n+1}$; and further comprising:
a capacitor insulation level disposed between the capacitor level and $M_n$.

6. The device of claim 5 wherein the bottom capacitor electrode comprises tantalum.

7. The device of claim 5 wherein the capacitor dielectric comprises silicon nitride.

8. The device of claim 5 wherein the top capacitor electrode comprises tantalum.

9. The device of claim 1 further comprising:
a resistor level having a resistor disposed in the BEOL dielectric layer, the resistor level comprises a resistor electrode level disposed over a resistor isolation level, wherein the resistor isolation level comprises a resistor dielectric isolating the resistor electrode level from a level of the BEOL dielectric layer below; and
a resistor electrode disposed in the resistor electrode level over the resistor isolation level, the resistor electrode comprises rounded edges at an interface of the resistor electrode and the resistor dielectric.

10. The device of claim 9 wherein the resistor level is integrated as part of the capacitor level, wherein the resistor isolation level is integrated as part of a capacitor dielectric level, which comprises the capacitor dielectric, and the resistor electrode level is integrated as part of a top capacitor electrode level which comprises the top capacitor electrode.

11. The device of claim 10 wherein the resistor dielectric and capacitor dielectric comprise the same dielectric material, and the resistor electrode and top capacitor electrode comprise the same electrode material.

12. The device of claim 9 wherein the resistor electrode and the top capacitor electrode each comprise tantalum.

13. A device comprising:
   a substrate with circuit components;
   a back-end-of-line (BEOL) dielectric layer having a plurality of interlevel dielectric (ILD) levels, wherein an ILD level includes a metal ILD level with metal lines and an ILD via contact ILD level with via contacts for interconnection with the circuit components; and
   a resistor level having a resistor disposed in the BEOL dielectric layer between upper and lower metal levels of lower and upper ILD levels, wherein the resistor level comprises a resistor electrode level disposed over a resistor isolation level, the resistor isolation level comprises a resistor dielectric isolating the resistor electrode level from the lower metal level, a resistor electrode is disposed in the resistor electrode level over the resistor isolation level, and the resistor electrode comprises rounded edges at an interface of the resistor electrode and the resistor dielectric.

14. A method of forming a device, the method comprising:
   providing a substrate with circuit components;
   forming a back-end-of-line (BEOL) dielectric layer having a plurality of interlevel dielectric (ILD) levels, wherein an ILD level includes a metal ILD level with metal lines and an ILD via contact ILD level with via contacts for interconnection with the circuit components;
   forming a capacitor level disposed between lower and upper metal levels of lower and upper ILD levels of the BEOL dielectric layer, forming the capacitor level includes:
   forming a capacitor, wherein forming the capacitor comprises
      forming a bottom capacitor electrode;
      disposing a capacitor dielectric on the bottom capacitor electrode; and
      disposing a top capacitor electrode above the capacitor dielectric,
   wherein the top capacitor electrode comprises a sidewall profile with rounded corners at an interface of the top capacitor electrode and the capacitor dielectric.

15. The method of claim 14 wherein forming the capacitor level comprises:
   disposing the capacitor level within a via level dielectric $V_n$ above a metal level $M_n$ and below a metal level $M_{n+1}$; and
   disposing a capacitor insulation level between the capacitor level and $M_n$.

16. The method of claim 14 further comprising:
   disposing a resistor level having resistor in the BEOL dielectric, the resistor level comprises disposing a resistor electrode level over a resistor isolation level, wherein the resistor isolation level comprises a resistor dielectric isolating the resistor electrode level from a level of the BEOL dielectric layer below; and
   disposing a resistor electrode in the resistor electrode level over the resistor isolation level, wherein the resistor electrode comprises rounded edges at an interface of the resistor electrode and the resistor dielectric.

17. The method of claim 16 wherein disposing the resistor level comprises integrating the resistor level as part of the capacitor level, wherein the resistor isolation level is integrated as part of a capacitor dielectric level which comprises the capacitor dielectric, and the resistor electrode level is integrated as part of a top capacitor electrode level which comprises the top capacitor electrode.

18. A method of forming a device, the method comprising:
   providing a substrate with circuit components;
   forming a back-end-of-line (BEOL) dielectric layer having a plurality of interlevel dielectric (ILD) levels, wherein an ILD level includes a metal ILD level with metal lines and an ILD via contact ILD level with via contacts for interconnection with the circuit components; and
   disposing a resistor level having a resistor in the BEOL dielectric layer between upper and lower metal levels of lower and upper ILD levels, wherein disposing the resistor level comprises
   disposing a resistor electrode level over a resistor isolation level, wherein the resistor isolation level comprises a resistor dielectric isolating the resistor electrode level from the lower metal level, and
   disposing a resistor electrode in the resistor electrode level over the resistor isolation level, the resistor electrode comprises rounded edges at an interface of the resistor electrode and the resistor dielectric.

* * * * *